United States Patent [19]
Bond

[11] Patent Number: 5,432,725
[45] Date of Patent: Jul. 11, 1995

[54] SELF-ADAPTING FILTER
[75] Inventor: James W. Bond, San Diego, Calif.
[73] Assignee: The United States of America as represented by the Secretary of the Navy, Washington, D.C.
[21] Appl. No.: 167,748
[22] Filed: Dec. 15, 1993
[51] Int. Cl.⁶ .................. G06F 15/31; H03H 7/30; H03H 7/40
[52] U.S. Cl. .................. 364/724.19; 364/724.17; 364/724.13; 375/232; 375/235
[58] Field of Search .................. 364/724.01, 724.13, 364/724.06, 724.08, 724.09, 724.17, 718–721; 375/14, 15, 17, 18, 20, 99, 103

[56] References Cited
U.S. PATENT DOCUMENTS

| | | | |
|---|---|---|---|
| 4,290,139 | 9/1981 | Walsh | 375/14 |
| 4,635,276 | 1/1987 | Karabinis | 375/15 |
| 4,644,562 | 2/1987 | Kauehrad et al. | 375/14 |
| 4,809,298 | 2/1989 | Sakane et al. | 375/17 |
| 4,847,797 | 7/1989 | Picchi et al. | 364/602 |
| 4,980,849 | 12/1990 | Baseghi | 364/724.17 |
| 5,005,185 | 4/1991 | Mizoguchi et al. | 375/15 |
| 5,130,943 | 7/1992 | Gazsi et al. | 364/724.19 |
| 5,353,307 | 10/1994 | Lester et al. | 375/14 |

Primary Examiner—Roy N. Envall, Jr.
Assistant Examiner—Emmanuel Moise
Attorney, Agent, or Firm—Harvey Fendelman; Thomas Glenn Keough; Peter A. Lipovsky

[57] ABSTRACT

The Self-Adapting Filter is an adaptive interference suppression device that can be used to extract bandspread communication signals from a received signal containing significant structured interference. The filter processes signal quantities consisting of inphase and quadrature (real and imaginary) components of received signal baseband samples. Process weights are calculated directly from the symmetric differences of the signal samples. Calculating the statistics of the samples is not necessary, nor is the calculation and use of signal sample magnitude and phase. By processing components of the received signal baseband samples directly, a simple implementation of an approximate locally optimum processing algorithm is possible enabling simple filter hardware and operation. All processing can be pipelined.

4 Claims, 3 Drawing Sheets ations.

SELF-ADAPTING FILTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention relates generally to the suppression of interference amongst communication signals. In greater particularity, the invention relates to an interference canceler capable of canceling a wide variety of interferers using simple processing and simple hardware.

2. Description of Related Art

Radios may receive three forms of signals: noise, interference and communication. Noise can be caused naturally by lightning and the like and is largely unpredictable. Few steps are taken towards its elimination. Interference can be caused inadvertently, such as by the broadcasting of several stations on the same band, or can be caused deliberately, such as by the transmission of signals to intentionally mask communication signals. A number of techniques are used to combat interference.

Adaptive filtering is one technique used in military radios to cancel narrowband interference non-Gaussian in structure.

Two main categories of adaptive filters exist. One category is adaptive Wiener filters. In Wiener filters, weights are typically determined through the statistics of the temporal correlation of signal samples. A second category of adaptive filtering is adaptive locally optimum processing. Typically, such processing requires the calculation and use of the magnitudes and phases of complex samples and is commonly accomplished in serial steps involving weight calculations based upon the statistics of the samples taken. The weights are adapted to minimize the average magnitudes of the filter outputs.

Less complex and more efficient adaptive interference filters are needed to cancel both narrowband and broadband interferences.

SUMMARY OF THE INVENTION

The Self-Adapting Filter of the invention is a simple adaptive interference suppression device that can be used to extract bandspread communication signals from a received signal containing significant structured interference. The Self-Adapting Filter processes signal quantities consisting of inphase and quadrature (real and imaginary) components of received signal baseband samples. Process weights are calculated directly from signal samples. Calculating the statistics of the samples is not necessary, nor is the calculation and use of signal sample magnitude and phase.

By processing components of the received signal baseband samples directly, a simple implementation of an approximate locally optimum processing algorithm is possible enabling simple filter hardware and operation. All processing can be pipelined.

OBJECTS OF THE INVENTION

It is an object of the invention to provide an improved interference filter.

Another object of the invention is to provide an interference filter that cancels unwanted narrowband and broadband interferences.

A further object of the invention is to provide an interference filter that is simple in structure and oper Other objects, advantages and new features of the invention will become apparent from the following detailed description of the invention when considered in conjunction with the accompanying drawings.

DESCRIPTION OF THE PREFERRED EMBODIMENT

Figure 1:
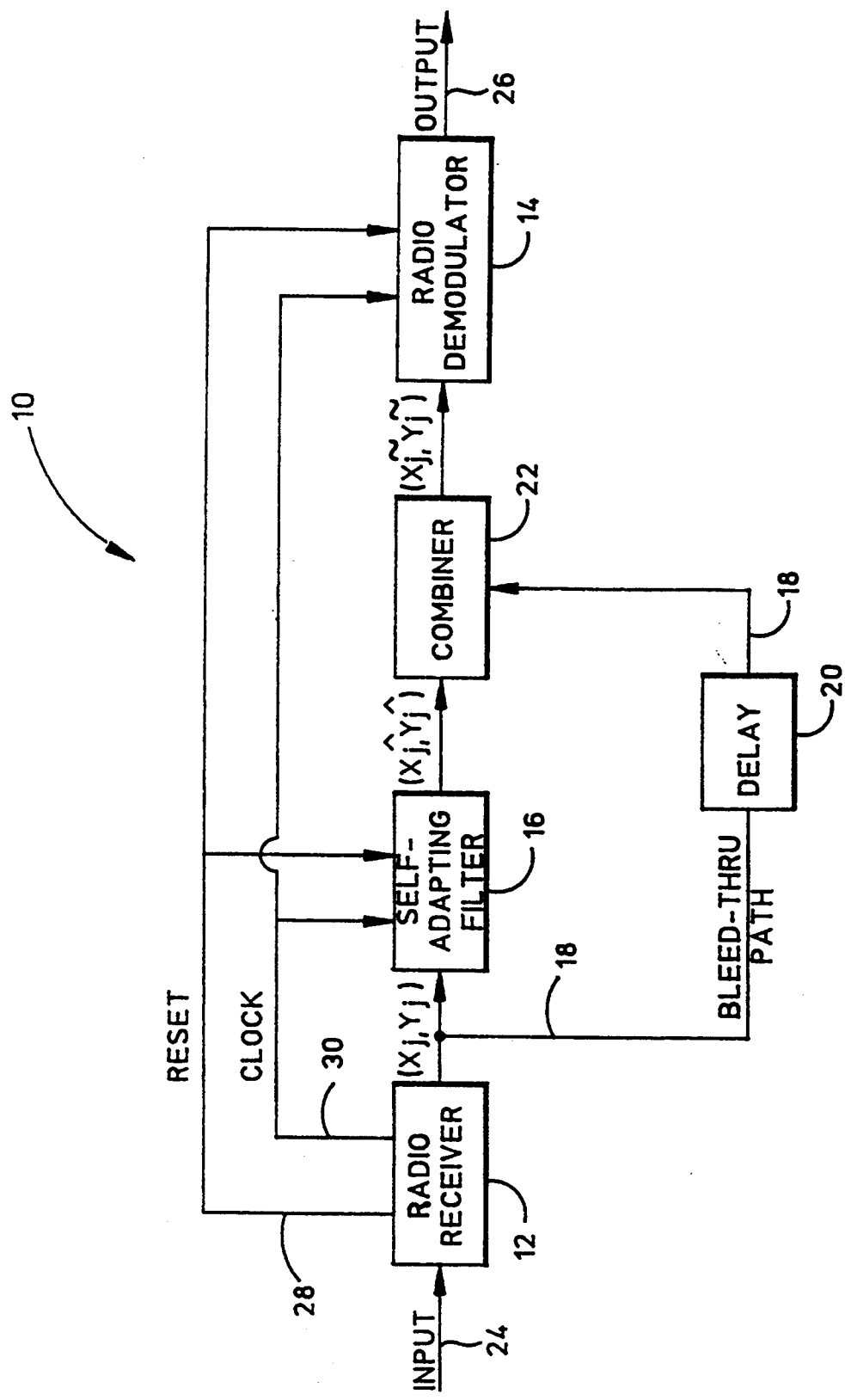
FIG. 1 is a block diagram of an interference suppression system incorporating the invention.

In FIG. 1 there is shown an interference suppression system 10 according to the invention. System 10 includes components of a typical radio, including a receiver 12 and a demodulator 14. A Self-Adapting Filter 16, according to the invention, is inserted between receiver 12 and demodulator 14 preferably as a stand-alone unit.

Self-Adapting Filter 16 is preferably used in conjunction with a bleed-through path 18. This path includes a delay 20 that is equated with the processing delay taking place in filter 16. Signals delayed through bleed-through path 18 and those output from filter 16 are combined in a combiner 22 to be described.

A preferred embodiment of the invention is designed for the reception of band-spread signals having each information bit spread by a factor of 10 or more. Those skilled in the art will realize though that other spread factors may be used. For the invention to be used with a radio, the radio must provide a bypass of filter 16 for reception of communication signals which are not bandspread. This bypass, not shown, may be constructed according to conventional techniques.

Radio receiver 12 converts input signals 24 into a sequence of inphase and quadrature samples of the received signal, designated here as $x_j$ and $y_j$, respectively, with j being an arbitrary index. This input pair is also known as a complex sample of the received signal for index j and can be viewed as a vector with x-component $x_j$ and y-component $y_j$.

Signals $x_j$ and $y_j$ are the centermost pair of a representative number $(2N+1)$ of received signal samples taken:

$$(x_{j-N}, y_{j-N}), \ldots (x_j, y_j), \ldots (x_{j+N}, y_{j+N}).$$

The output of filter 16 is a sequence of interference suppressed, transformed inphase and quadrature samples, $x_j'$ and $y_j'$, respectively. A reset signal 28 and a clock signal 30, from radio 12, are used in filter 16 to synchronize its operation with radio receiver 12 and demodulator 14.

The factors $x_j'$ and $y_j'$ are adaptively weighted averages of $$x_{j-N}, \ldots, x_{j-1}, x_j, x_{j+1}, \ldots, x_{j+N} \text{ and}$$

$$y_{j-N}, \ldots, y_{j-1}, y_j, y_{j+1}, \ldots, Y_{j+N},$$

respectively, for N a positive integer. For efficiency in computation, N should be a positive power of 2.

Output 26 of interference suppression system 10 is delayed relative to its input 24 by the processing of the samples in filter 16. Delay 20 is equated with this processing delay. Demodulator 14 should be modified in a conventional way to account for this delay in order to despread the received signal.

Figure 2:
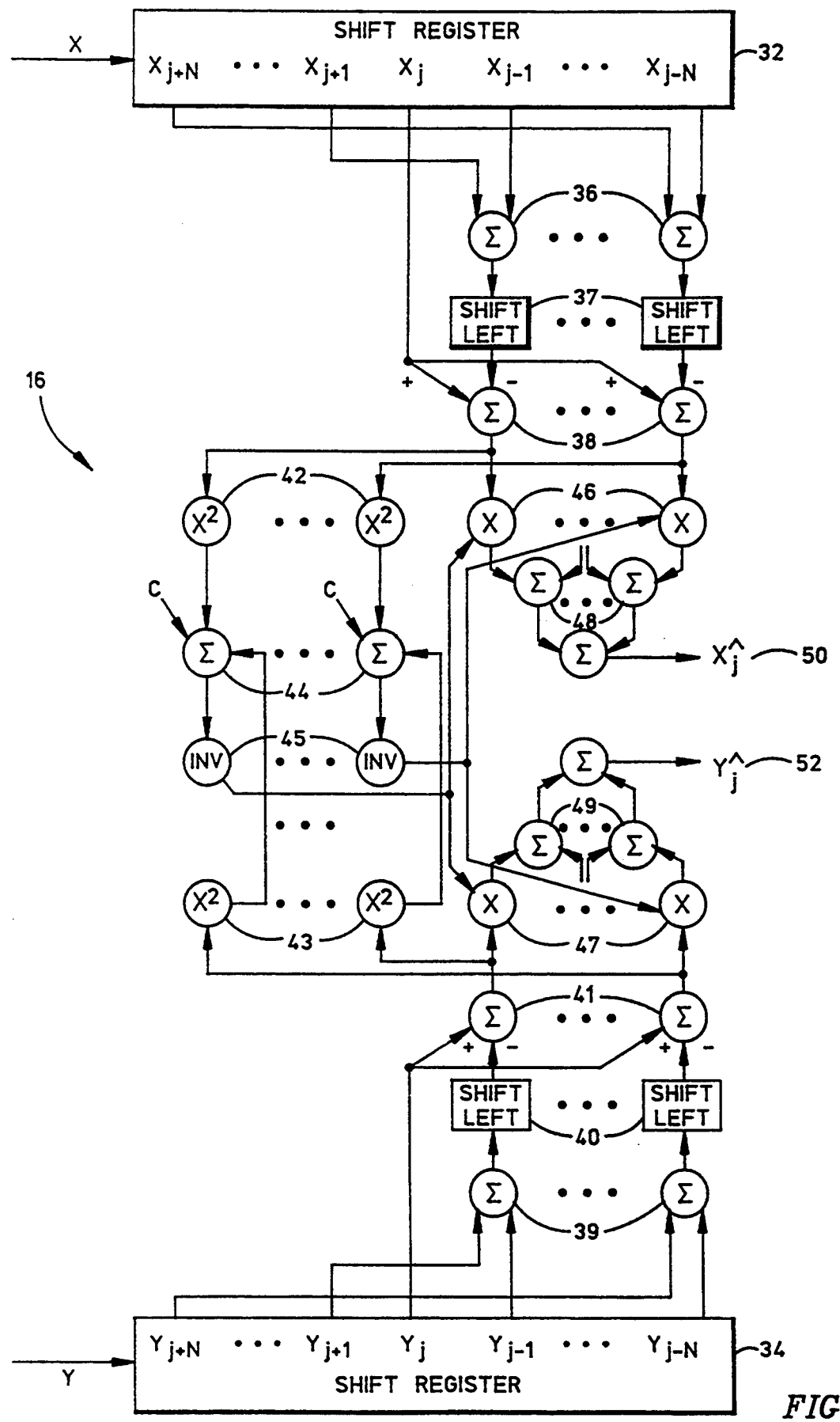
FIG. 2 is a representative implementation of a Self-Adapting Filter according to the invention.

Illustrated in FIG. 2 is a representative diagram of Self-Adapting Filter 16, showing components of this filter. In the preferred embodiment shown, all input and output quantities are represented by at least 16-bit integers and all calculations performed by the components of the invention are done with 16-bit or higher precision. Of course, those skilled in the art will realize that these quantities may be changed dependent upon component availability, computation time required and/or other factors.

In the operation of filter 16, the inphase and quadrature samples, $x_j$ and $y_j$, respectively, are each processed approximately simultaneously using the same weights. This simultaneous, parallel, processing enhances the efficiency of the filter. The processing of samples $x_j$ are shown in FIG. 2 from top down and of sample $y_j$ from bottom up so that the processor structure is symmetric.

This invention departs from the way filter weights are usually adapted to enable the invention to filter a larger class of interferers. This departure is accomplished through the filtering of the "symmetric difference" of the inphase and quadrature components of the signal samples, rather than through the amplitudes and phases of the signal samples.

FIG. 2 represents the circuitry to calculate:

$$x_j\hat{} = \sum_{k=1}^{N} w(k)(x_j - (1/2)(x_{j-k} + x_{j+k}))$$

where $(x_j - (\frac{1}{2})(x_{j-k} + x_{j+k}))$ is the symmetric difference for inphase sample $x_j$, and $x_j\hat{}$ is the average adaptively weighted inphase component of the received signal samples, and $$y_j\hat{} = \sum_{k=1}^{N} w(k)(y_j - (1/2)(y_{j-k} + y_{j+k}))$$

where $(y_j - (\frac{1}{2})(y_{j-k} + y_{j+k}))$ is the symmetrical difference for quadrture sample $y_j$, with $$w(k) = 1/[C + (x_j - (\tfrac{1}{2})(x_{j-k} + x_{j+k}))^2 + (y_j - (\tfrac{1}{2})(y_{j-k} + y_{j+k}))^2]$$

in which w(k) is the filter weight corresponding to signal group (k).

The constant C, used throughout this specification, represents any positive value and can be experimented with to find an optimum value for a particular system. This value can be taken as 1 as a starting point. The best value of C will depend upon the particular application of the invention.

Shift registers 32 and 34 are each of length 2N+1. The rows identified as element numbers 36–47 each contain N identical components. The N adders of row 36, left to right, calculate the quantities $x_{j-k} + x_{j+k}$ for k = 1 through N. The N shift registers of row 37 shift the magnitudes of each of these quantities one to the left to form $(\frac{1}{2})(x_{j-k} + x_{j+k})$. The N adders of row 38 form the symmetric differences $x_j - (\frac{1}{2})(x_{j-k} + x_{j+k})$ for the reference sample $x_j$.

The N adders of row 39, left to right, calculate the quantities $y_{j-k} + y_{j+k}$ for k = 1 through N. The N shift registers of row 40 shift the magnitudes of each of these quantities one to the left to form $(\frac{1}{2})(y_{j-k} + y_{j+k})$. The N address of row 41 form the symmetric differences $y_j - (\frac{1}{2})(y_{j-k} + y_{j+k})$ for the reference sample $y_j$.

The elements in rows 42, 43, 44 and 45 calculate the weights w(k), k = 1 through N. The squarers in row 42 calculate $(x_j - (\frac{1}{2})(x_{j-k} + x_{j+k}))^2$ and those in row 43 calculate $(y_j - (\frac{1}{2})(y_{j-k} + y_{j+k}))^2$. The adders in row 44 calculate $$C + (x_j - (\tfrac{1}{2})(x_{j-k} + x_{j+k}))^2 + (y_j - (\tfrac{1}{2})(y_{j-k} + y_{j+k}))^2.$$

The inverters in row 45 complete the calculation of the filter weights by forming $$1/\{C + (x_j - (\tfrac{1}{2})(x_{j-k} + x_{j+k}))^2 + (y_j - (\tfrac{1}{2})(y_{j-k} + y_{j+k}))^2\}.$$

The multipliers in row 46 calculate the weighted symmetric difference $w(k)(x_j - (\frac{1}{2})(x_{j-k} + x_{j+k}))$ and those in row 47 calculate the weighted symmetric difference $w(k)(y_j - (\frac{1}{2})(y_{j-k} + y_{j+k}))$. The array of adders 48 complete the calculation of output $x_j\hat{}$ shown as 50 and the array of adders 49 complete the calculation of output $y_j\hat{}$ shown as 52. Each of these adder arrays contain N/2 adders in its first row, N/4 adders in the next row, until a final adder in its last row.

Figure 3:
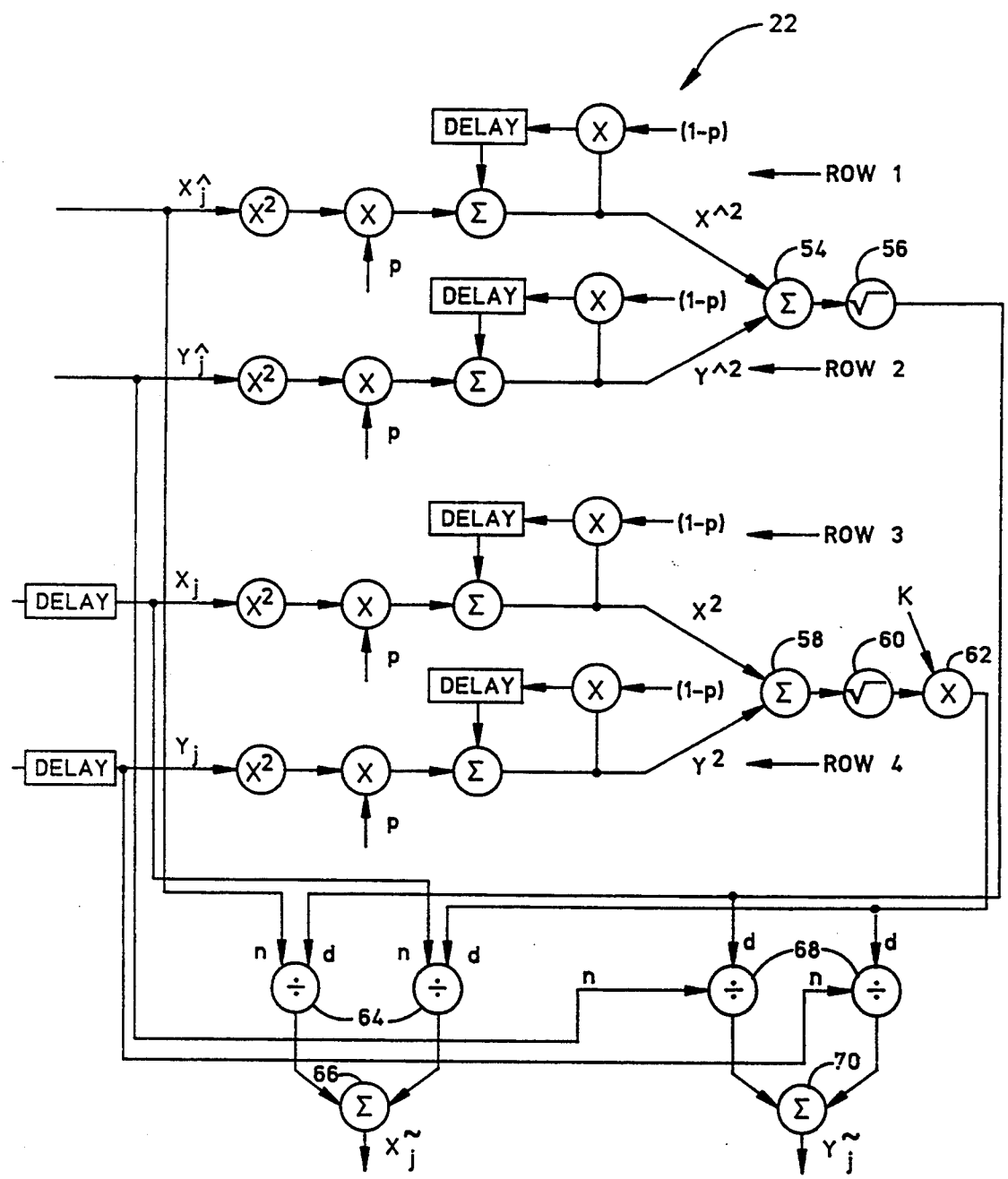
FIG. 3 is a representative implementation of a combiner as may be utilized in an interference suppression system incorporating the invention.

Referring now to FIG. 3, recursive combiner 22 of FIG. 1 is shown in detail. Recursive combiner 22 is used to combine the bleed-through term $(x_j, y_j)$ from delay 20 of FIG. 1 with the Self-Adapting Filter outputs $(x_j\hat{}, y_j\hat{})$. There are two parameters in the recursive combiner, p and K. The constant p controls the averaging time of the output sample values and K reduces the value of the bleed-through term. In general, a preferred value for p is 1/N and for K is 4.

The first row of components of the combiner, indicated as row 1 on FIG. 3, calculates $$x\hat{}^2 = px_j\hat{}^2 + p(p-1)x_{j-1}\hat{}^2 + p(p-1)^2 x_{j-2}\hat{}^2 + p(p-1)^3 x_{j-3}\hat{}^2 + \ldots,$$

row two of the components calculates $$y\hat{}^2 = py_j\hat{}^2 + p(p-1)y_{j-1}\hat{}^2 + p(p-1)^2 y_{j-2}\hat{}^2 + p(p-1)^3 y_{j-3}\hat{}^2 + \ldots,$$

row three of the components calculates $$X^2 = px_j^2 + p(p-1)x_{j-1}^2 + p(p-1)^2 x_{j-2}^2 + p(p-1)^3 x_{j-3}^2 + \ldots,$$

and row four of components calculates $$y^2 = py_j^2 + p(p-1)y_{j-1}^2 + p(p-1)^2 y_{j-2}^2 + p(p-1)^3 y_{j-3}^2 + \ldots$$

The recursive sums, $X\hat{}^2$ and $Y\hat{}^2$, are added in adder 54 and the square root 56 is calculated to obtain an estimate of the average magnitude Z of the outputs of the Self-Adjusting Filter. The recursive sums $X^2$ and $Y^2$ are added 58 and the square root 60 is calculated to obtain an estimate of the average magnitude $z\hat{}$ of the bleed-through term. The bleed-through magnitude is multiplied, shown as 62, by constant K. Dividers 64 and adder 66 of FIG. 3 are used to calculate $$x_j^\sim = x_j^\wedge/Z^\wedge + x_j/(KZ)$$

and the two dividers 68 and adder 70 to the right in FIG. 3 are used to calculate $$Y_j^\sim = y_j^\wedge/Z^\wedge + y_j/(KZ).$$

The quantities $x_j^\sim$ and $y_j^\sim$ are the outputs of the invention input into the radio demodulator 14 of FIG. 1.

The principle of operation of the invention will now be summarized. Suppose that $$(x_j, y_j) = z_j = s_j + n_j + u_j,$$

where $s_j$, $n_j$ and $u_j$ are the communication signal, Gaussian noise, and interference components of the received signal vector $z_j$, respectively. Then $$(x_j^\wedge, y_j^\wedge) = \sum_{k=1}^{N} w(k)(z_j - (1/2)(z_{j-1} + z_{j+1}))$$

$$= \sum_{k=1}^{N} w(k)(s_j - (1/2)(s_{j-1} + s_{j+1})) +$$

$$\sum_{k=1}^{N} w(k)(n_j - (1/2)(n_{j-1} + n_{j+1})) +$$

$$\sum_{k=1}^{N} w(k)(u_j - (1/2)(u_{j-1} + u_{j+1})).$$

If the interference vector u has much greater magnitude than the communication signal s and the Gaussian noise n, then the weights w(k) will be small when the interferer term $u_j - (\frac{1}{2})(u_{j-k} + u_{j+k})$ is large and the weights will be large when this interference term is small. This makes it so that the filter of the invention emphasizes the terms $z_j - (\frac{1}{2})(z_{j-1} + z_{j+1})$ with the smallest contribution of interference. In addition, whenever the interferer vector is slowly changing, the term $u_j - (\frac{1}{2})(u_{j-k} + u_{j+k})$ will be nearly 0 and the invention will provide substantial processing gain.

The Gaussian noise increases by the factor 3/2 due to the processing when the interference is dominant. This occurs because the factor $n_j - (\frac{1}{2})(n_{j-k} + n_{j+k})$ increases the variability of the underlying noise by 3/2.

The communication signal component is also somewhat reduced when the interference is dominant because sometimes $s_j - (\frac{1}{2})(s_{j-k} + s_{j+k})$ can be 0 for a bandspread signal. If the interference signal is not dominant, the terms for which the communication signal term is small would be emphasized, leading to considerable cancellation of the communication signal. For this reason, a bleed-through path is utilized in the invention to provide performance when there is little interference.

As an alternative embodiment, the invention can be bypassed altogether through a switch that turns the filter of the invention off in cases where there is not dominant interference. Such a switch would make the bleed-through path unnecessary. In this case the recursive combiner shown as element 22 of FIG. 1 would not be needed. The radio synchronization process can be used to switch on the invention if synchronization (communication) cannot be attained with the invention off.

Obviously, many modifications and variations of this invention are possible in light of the above teachings. It is therefore to be understood that within the scope of the appended claims the invention may be practiced other than as has been specifically described.

What is claimed is:

1. A method comprising the steps of:
   receiving a signal;
   sampling said signal to get a sequence of signal samples;
   converting each of said signal samples into inphase and quadrature components:
   forming a sequence of said inphase components and forming a sequence of said quadrature components;
   forming symmetric differences of said sequence of inphase components and forming symmetric differences of said sequence of quadrature components;
   computing a filter weight based on a combination of said symmetric differences of said sequence of inphase components and of said symmetric differences of said group of quadrature components;
   multiplying said filter weight by said symmetric differences of said sequence of inphase components to obtain a weighted symmetric difference inphase signal and multiplying said filter weight by said symmetric differences of said sequence of quadrature components to obtain a weighted symmetric difference quadrature signal; and
   inserting said weighted symmetric difference inphase signal and said weighted symmetric difference quadrature signal into a demodulator.

2. A method according to claim 1 in which said signal is a radio frequency signal.

3. A method comprising the steps of:
   receiving a signal;
   sampling said signal to get sequences of signal samples, each of said sequences having a larger number of signal samples than a next smaller sequence and including all signal samples of said next smaller sequence;
   for each of said sequences of signal samples, converting each signal sample therein into inphase and quadrature components;
   for each of said sequences of signal samples, forming symmetric differences of said inphase components and forming symmetric differences of said quadrature components;
   for each of said sequences of signal samples, computing a filter weight based on a combination of said symmetric differences of said sequence of inphase components and of said symmetric differences of said sequence of quadrature components;
   multiplying each sequence's filter weight by said sequence's inphase symmetric differences to obtain adaptively weighted inphase signals and multiplying each sequence's filter weight by said sequence's quadrature symmetric differences to obtain adaptively weighted quadrature signals;
   summing said adaptively weighted inphase signals to obtain a transformed inphase signal sample;
   summing said adaptively weighted quadrature signals to obtain a transformed quadrature signal sample; and
   inserting said transformed inphase signal sample and said transformed quadrature signal sample into a demodulator.

4. A method according to claim 3 in which said signal is a radio frequency signal.

* * * * *